United States Patent [19]
Koh

[11] Patent Number: 6,060,353
[45] Date of Patent: May 9, 2000

[54] METHOD OF FORMING A RING SHAPED STORAGE NODE STRUCTURE FOR A DRAM CAPACITOR STRUCTURE

[75] Inventor: Chao-Ming Koh, Hsin-Chu, Taiwan

[73] Assignee: Vanguard International Semiconductor Corporation, Hsin-Chu, Taiwan

[21] Appl. No.: 09/422,176

[22] Filed: Oct. 22, 1999

[51] Int. Cl.[7] .............................................. H01L 21/8242
[52] U.S. Cl. ........................................ 438/253; 438/396
[58] Field of Search .................................. 438/239, 241, 438/253, 254, 255, 256, 381, 393, 396, 397, 398

[56] References Cited

U.S. PATENT DOCUMENTS

| | | | |
|---|---|---|---|
| 5,278,091 | 1/1994 | Fazan et al. | 438/398 |
| 5,369,048 | 11/1994 | Hsue | 437/52 |
| 5,387,533 | 2/1995 | Kim | 437/52 |
| 5,681,773 | 10/1997 | Tseng | 438/396 |
| 5,736,761 | 4/1998 | Risch et al. | 257/301 |
| 5,804,852 | 9/1998 | Yang et al. | 257/308 |
| 5,854,119 | 12/1998 | Wu et al. | 438/396 |
| 5,943,582 | 8/1999 | Huang et al. | 438/396 |
| 5,953,608 | 9/1999 | Hirota | 438/253 |

*Primary Examiner*—Charles Bowers
*Assistant Examiner*—Jack Chen
*Attorney, Agent, or Firm*—George O. Saile; Stephen B. Ackerman

[57] ABSTRACT

A process for forming a cylindrical shaped, storage node structure, for a DRAM capacitor, has been developed. The process features forming a capacitor opening, in an insulator layer, exposing the fop surface of a storage node plug structure, located at the periphery of the capacitor opening. The deposition of a conductive layer, followed by a blanket, anisotropic RIE procedure, results in the creation of a cylindrical shaped, storage node structure, on the sides of the capacitor opening, with contact to the underlying storage node plug structure, accomplished via a segment of the cylindrical shaped, storage node structure, overlying a portion of the top surface of the underlying storage node plug structure. The cylindrical shaped, storage node structure described on this invention, is formed without the use of the costly CMP procedure, and without the use of the costly and complex, photoresist plug, used to protect the bottom portion of a storage node structure, employed for the fabrication of counterpart, crown shaped storage node structures.

21 Claims, 4 Drawing Sheets

METHOD OF FORMING A RING SHAPED STORAGE NODE STRUCTURE FOR A DRAM CAPACITOR STRUCTURE

BACKGROUND OF THE INVENTION (1) Field of the Invention

The present invention relates to methods used to fabricate semiconductor devices, and more specifically to a method used to form a ring shaped, or a cylindrical shaped, storage node structure, for a dynamic random access memory, (DRAM), device.

(2) Description of Prior Art

The semiconductor industry is continually striving to improve the performance of semiconductor devices, such as DRAM memory devices The DRAM device is usually comprised of a transfer gate transistor, and a capacitor structure, such as an overlying stacked capacitor structure. The signal, or performance of the DRAM device, is dependent on the magnitude of capacitance supplied by the stacked capacitor structure. The capacitance of the stacked structure can be increased via increases in the surface area of the storage node component of the capacitor, however the horizontal dimension of the overlying stacked capacitor structure is limited by the horizontal dimension of the underlying transfer gate transistor, and since another objective of the semiconductor industry is to decrease the size of the semiconductor chip, increasing the horizontal dimension of a transfer gate transistor, and of an overlying stacked capacitor structure, is not a viable option.

A method used to increase storage node area, without increasing the horizontal dimension of this structure, has been the use of crown shaped, storage node structures, such as a polysilicon crown shaped storage node structure, comprised of multiple vertical polysilicon features, and comprised of a horizontal polysilicon feature, with the horizontal polysilicon feature overlying, and contacting, an underlying storage node plug, and connecting the multiple, vertical polysilicon features. However the fabrication process used for crown shaped storage node structures, such as the structures described by Yang et al, in U.S. Pat. No. 5,804,852, can present process complexity, and increased cost. For example the exposed surfaces of a capacitor opening, in an insulator layer, are coated with a polysilicon layer, that the crown shaped storage node structure will be formed from. One method of defining the desired crown shaped storage node structure is the use of a chemical mechanical polishing. (CMP), procedure, employed to remove the region of the polysilicon layer, located on the top surface of the insulator layer, in which the capacitor opening is formed in, resulting in the crown shaped storage node structure, in the capacitor opening. However this method can result in particles from a CMP slurry, locating on the horizontal polysilicon feature, at the bottom of the capacitor opening, interfering with the subsequent formation of a capacitor dielectric layer, on the surface of the crown shaped storage node structure. The capacitor opening can be protected, or filled by a photoresist plug, however the additional cost of forming the photoresist plug, in the capacitor opening, in addition to the process needed to remove CMP slurry particles, from the top of the photoresist plug, adds complexity to an already complex and costly process.

This invention will describe a process for forming a cylindrical shaped, storage node structure, for a DRAM capacitor, without the use of a storage node defining, CMP procedure, thus avoiding the cost, and complexity, of storage node patterning sequences that employ a CMP procedure, and photoresist plugs. This invention will feature a polysilicon layer, coating, or lining, the exposed surfaces of a capacitor opening, however followed by a blanket, anisotropic, reactive ion etching, (RIE), procedure, used to remove regions of the polysilicon layer that reside on the top surface of the insulator layer, in which the capacitor opening was formed in, as well removing the region of polysilicon residing at the bottom of the capacitor opening, The capacitor opening was formed, exposing the underlying storage node plug structure, at the edge, or perimeter, of the capacitor opening, thus allowing an edge, or segment, of the cylindrical shaped, polysilicon storage node structure, to contact a portion of the top surface of the underlying storage node plug structure. Since contact between the cylindrical shaped storage node structure, and the underlying storage node plug structure, occurs at the edge of the capacitor opening, the connecting, horizontal polysilicon feature, is not needed, thus eliminating the need for a costly CMP procedure, and a complex process sequence, needed for the post-CMP cleans.

SUMMARY OF THE INVENTION

It is an object of this invention to fabricate a cylindrical shaped, storage node structure, for a DRAM capacitor.

It is another object of this invention to form the cylindrical shaped storage node structure, on the sides of a capacitor opening, in an insulator layer, via deposition of, and blanket, dry, anisotropic etching of, a conductive layer, such as polysilicon.

It is yet another object of this invention to provide communication between the cylindrical shaped, storage node structure, and an underlying source/drain region, of a transfer gate transistor, via a storage node plug structure, located in a storage node opening, in an insulator layer, and overlying and contacting, a portion of the underlying source/drain region, and underlying, and contacting, an edge, or a segment, of the overlying, cylindrical shaped, storage node structure.

In accordance with the present invention a method of fabricating a cylindrical shaped, storage node structure, for a DRAM capacitor, featuring an edge, or segment, of the cylindrical shaped storage node structure, contacting a portion of the top surface of an underlying storage node plug structure, is described. A storage node plug structure is formed in an opening in a first insulator layer, overlying and contacting, a source/drain region of a transfer gate transistor. A capacitor opening is created in a second insulator layer, with the top surface of the storage node plug structure, exposed at the edge of the capacitor opening. A polysilicon layer is deposited, and subjected to an anisotropic reactive ion etching, (RIE), procedure, resulting in a cylindrical shaped, storage node structure, residing on the walls of the capacitor opening, with an edge, or a segment, of the cylindrical shaped, storage node structure, overlying, and contacting, a portion of the top surface of an underlying storage node plug structure. A capacitor dielectric layer is formed on the cylindrical shaped, storage node structure, followed by the formation of an overlying polysilicon top plate structure, completing the fabrication of the DRAM capacitor structure, comprised with a cylindrical shaped, storage node structure, featuring an edge or segment of the cylindrical shaped, storage node structure, contacting a portion of the surface of an underlying storage node plug structure.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

The process used to create a cylindrical shaped, storage node structure, for a DRAM capacitor, via the use of only the deposition of, and the blanket dry etching of, a conductive layer, resulting in the contact of only an edge, or a of segment, of the cylindrical shaped, storage node structure, to a portion of the top surface of an underlying storage node plug structure, will now be described in detail. The transfer gate transistor used in this invention is a N channel device, however this invention can also used with P channel, transfer gate transistors.

Figure 1:
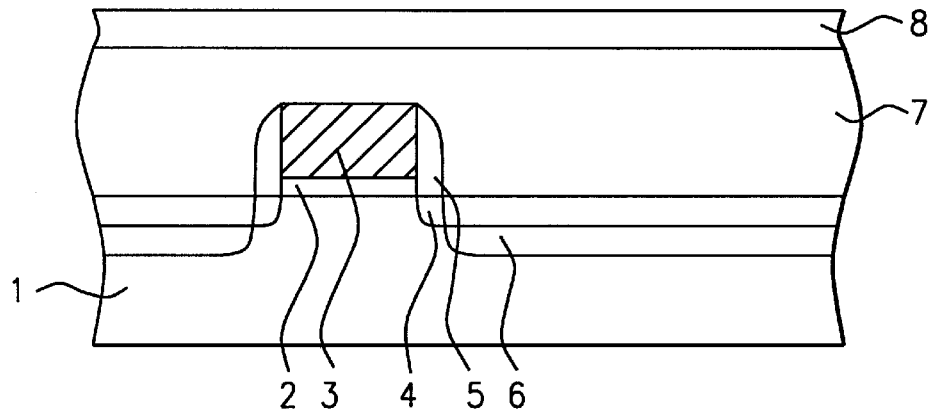
FIGS. 1–4, 5B, 6, and 7, which schematically, in cross-sectional style, show key stages of fabrication, used to create the cylindrical shaped, storage node structure, used as a component of a DRAM capacitor.

A P type, semiconductor substrate 1, comprised of single crystalline silicon, with a <100> crystallographic orientation, is used and shown schematically in FIG. 1. A gate insulator layer 2, comprised of silicon dioxide, at a thickness between about 20 to 100 Angstroms, is formed via thermal oxidation procedures, in an oxygen-steam ambient. A polysilicon layer is next deposited, via low pressure chemical vapor deposition, (LPCVD), procedures, at a thickness between about 500 to 2000 Angstroms, and either doped in situ, during deposition, via the addition of arsine, or phosphine, to a silane ambient, or deposited intrinsically, than doped via ion implantation procedures, using arsenic or phosphorous ions. Conventional photolithographic and anisotropic reactive ion etching, (RIE), procedures, using $Cl_2$ as an etchant for polysilicon, are used to create polysilicon gate structure 3, schematically shown in FIG. 1. The photoresist shape, used to define polysilicon gate structure 3, is removed via plasma oxygen ashing, and careful wet clean procedures. The wet clean procedures, also removes the region of gate insulator 2, not covered by polysilicon gate structure 3. Lightly doped source/drain region 4, is next formed, self-aligned to polysilicon gate structure 3, via ion implantation procedures, of arsenic or phosphorous ions, at an energy between about 10 to 100 KeV, at a dose between about 1E15 to 1E16 atoms/cm$^2$. A deposition of either silicon oxide,.or silicon nitride, is next performed, via LPCVD or plasma enhanced chemical vapor deposition, (PECVD), procedures, at a thickness between about 0 to 500 Angstroms, followed by an anisotropic RIE procedure using $CHF_3$ or $CF_4$ as an etchant, to create insulator spacers 5, on the sides of polysilicon gate structure 3. Heavily doped source/drain region 6, shown schematically in FIG. 1, is then formed, self-aligned to the insulator spacers, on polysilicon gate structure 3, via ion implantation of arsenic or phosphorous ions, at an energy between about 10 to 100 KeV, at a dose between about 1E15 to 1E16 atoms/cm$^2$.

First insulator layer 7, comprised of either a silicon oxide layer, or a borophosphosilicate glass, (BPSG), layer, is next deposited, via LPCVD or PECVD procedures, at a thickness between about 5000 to 10000 Angstroms. A chemical mechanical polishing procedure is employed for planarization purposes, resulting in a smooth top surface topography for insulator layer 7. This is schematically shown in FIG. 1. Also shown in FIG. 1, is insulator layer 8, comprised of either silicon nitride, or silicon oxynitride, obtained via LPCVD or PECVD procedures, at a thickness between about 200 to 1000 Angstroms.

Figure 2:
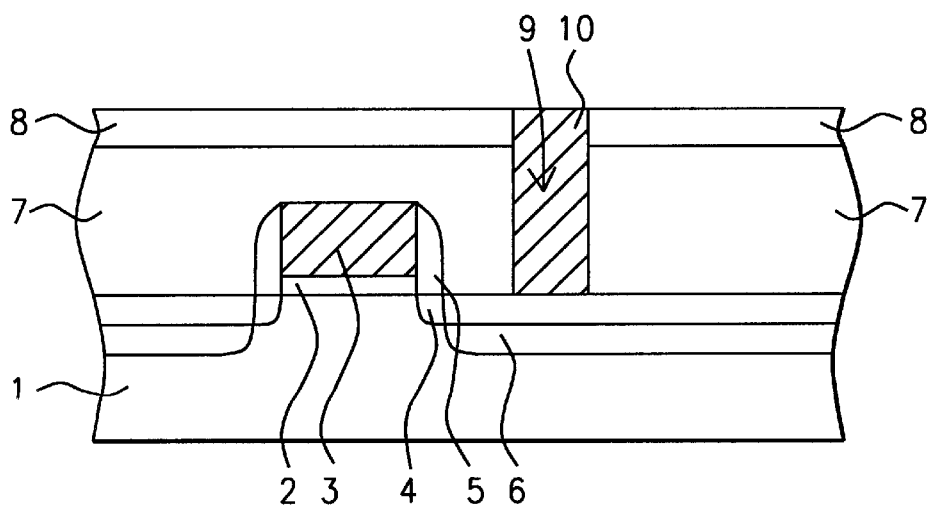

Conventional photolithographic and anisotropic RIE procedures, using $CF_4$ as an etchant for insulator layer 8, and using $CHF_3$ as an etchant for insulator 7, are used to form storage node contact hole 9, exposing a portion of the top surface of heavily doped source/drain region 6. After removal of the photoresist shape, used for definition of storage node contact hole 9, via plasma oxygen ashing and careful wet cleans, a polysilicon layer is deposited, via LPCVD procedures, to a thickness between about 1000 to 3000 Angstroms, completely filling storage node contact hole 9. The polysilicon layer is doped in situ, during deposition, via the addition of arsine, or phosphine, to a silane ambient. Removal of regions of the polysilicon layer, overlying the top surface of insulator layer 8. is accomplished via a CMP procedure, or via a selective RIE procedure, using $Cl_2$ as an etchant, creating storage node plug structure 10, in storage node contact hole 9, overlying and contacting a top portion of heavily doped source/drain region 6. This is schematically shown in FIG. 2.

Figure 3:
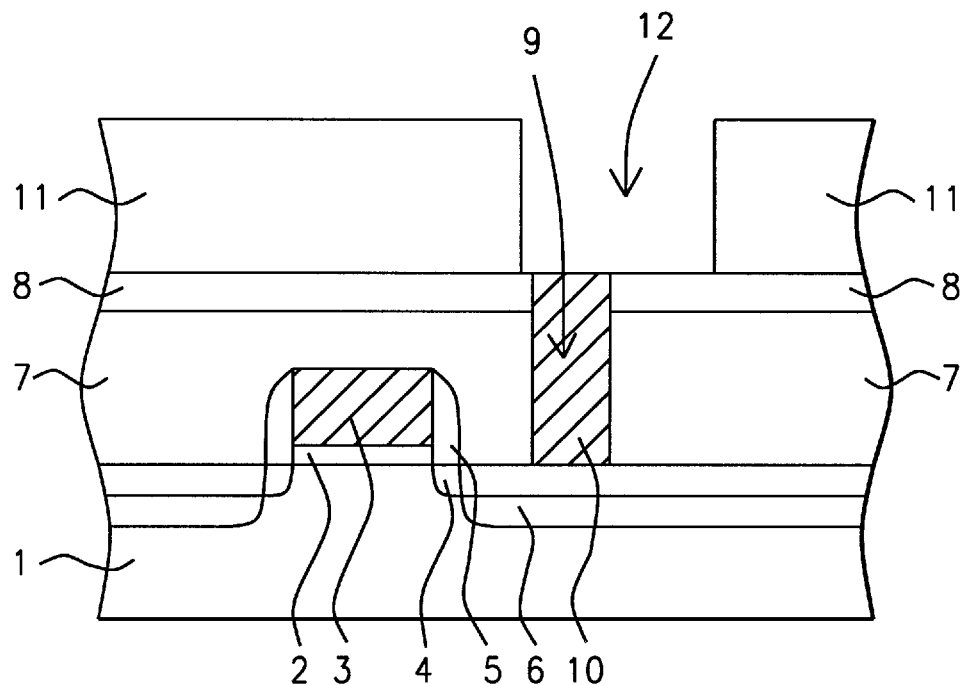

A third insulator layer, or a disposable insulator layer 11, comprised of silicon oxide, is next deposited via LPCVD or PECVD procedures, at a thickness between about 5000 to 20000 Angstroms. Photolithographic and anisotropic RIE procedures, using $CHF_3$ as an etchant, are used to create capacitor opening 12, shown schematically in FIG. 3. The top surface of storage node plug structure 10, is exposed at the periphery of capacitor opening 12, thus allowing a subsequent conductive, vertical feature, or an edge or segment, of the subsequent cylindrical shaped, storage node structure, located on the side of capacitor opening 12, to overlay, and to contact, a portion of underlying storage node plug structure 10.

Figure 4:
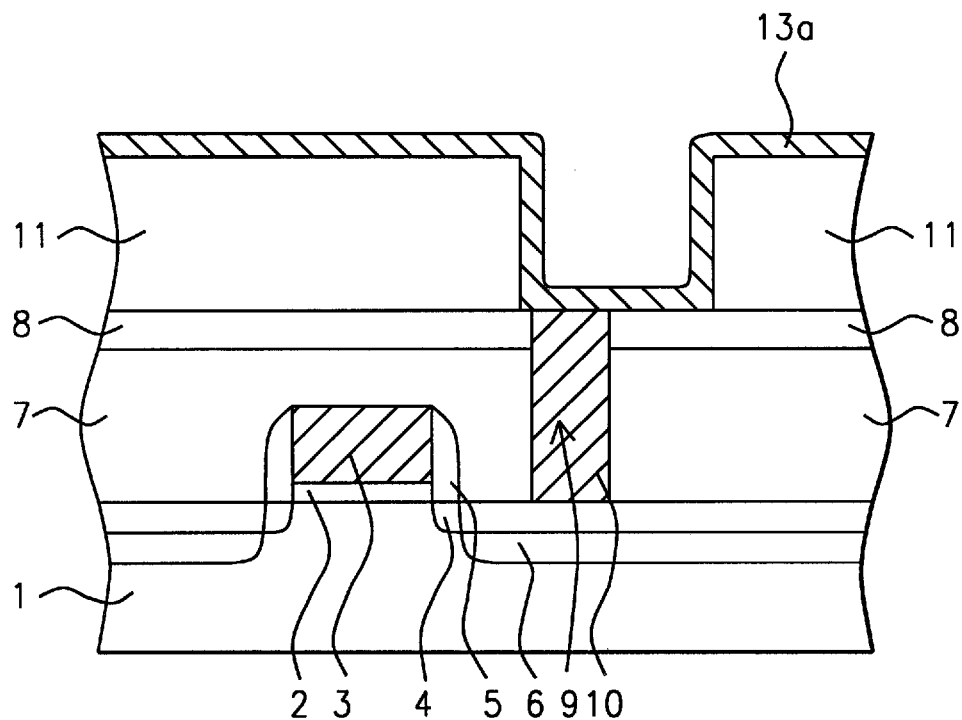
Figure 5A:
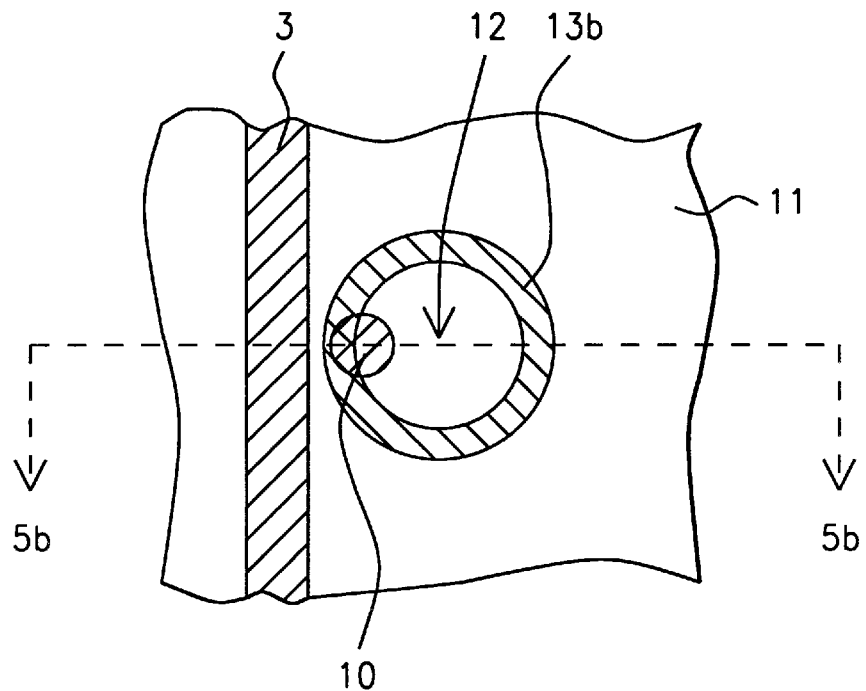
FIG. 5A, which schematically shows a top view of the cylindrical shaped, storage node structure, at a key stage of fabrication.
Figure 5B:
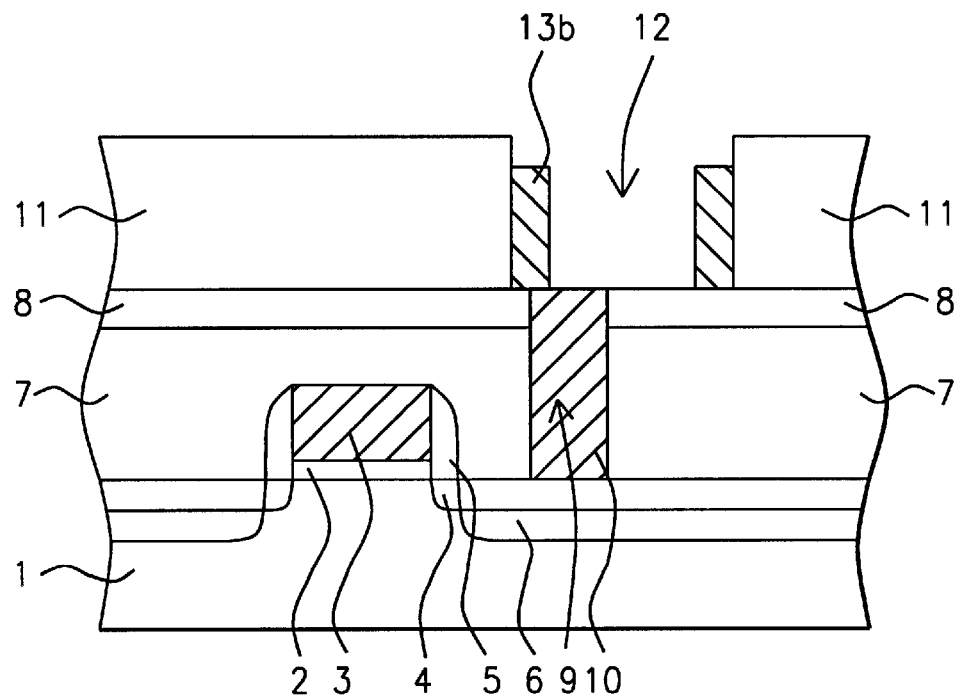

A conductive layer 13a, such as polysilicon, or metal, is next deposited, via LPCVD procedures, at a thickness between about 200 to 1000 Angstroms. The thickness of conductive layer 13a, is critical, since the amount of contact area between the vertical feature of conductive layer 13a, on the sides of capacitor opening 12, and the underlying storage node plug structure, is determined by this thickness. If polysilicon is used for conductive layer 13a, doping is accomplished in situ, via the addition of arsine, or phosphine, to a silane ambient. Conductive layer 13a, can also be a tungsten layer, or a metal silicide layer, such as tungsten silicide. This is schematically shown in FIG. 4. A selective, anisotropic RIE procedure, using $Cl_2$ as an etchant, is used to remove regions of conductive layer 13a, from the top surface of disposable insulator layer 11, as well removing the region of conductive layer 13a, from the bottom of capacitor opening 12, creating a cylindrical shaped, storage node structure 13b. This is shown schematically, in top view 5A, and schematically, in cross-sectional style, in FIG. 5B. It can be seen that contact between cylindrical shaped, storage node structure 13b, and underlying storage node plug structure 10, occurs at the edge of capacitor opening 11. The minimum area needed for adequate contact, or the minimum thickness of cylindrical shaped, storage node structure 13b, overlapping, or overlying, a portion of the top surface of underlying storage node plug structure 10, is between about 200 to 1000 Angstroms, while maximum contact between these structures will be the achieved via the entire thickness of conductive layer 13a, overlaying storage node plug structure 10. To insure complete removal of the horizontal component of conductive layer 13a, a RIE overetch cycle is used, resulting in the recessing of cylindrical shaped, storage node structure 13b, to a depth between about 5000 to 20000 Angstroms, below the top surface of disposable insulator 11. It should be noted that the desired cylindrical shaped storage node structure, in contrast to a crown shaped storage node counterpart, is formed without the use of a costly CMP procedure; without the use of a costly and complex, CMP cleanup procedure; and without the use of a costly photoresist plug procedure, used to protect a horizontal component, of a crown shaped, storage node structure. If desired a hemispherical grain, (HSG), silicon layer, can be formed on the exposed surfaces of cylindrical shaped, storage node structure 13b. The convex and concave features of the HSG silicon layer results in an increase in storage node surface area, when compared to counterpart storage node structures, fabricated with flat surfaces.

Figure 6:
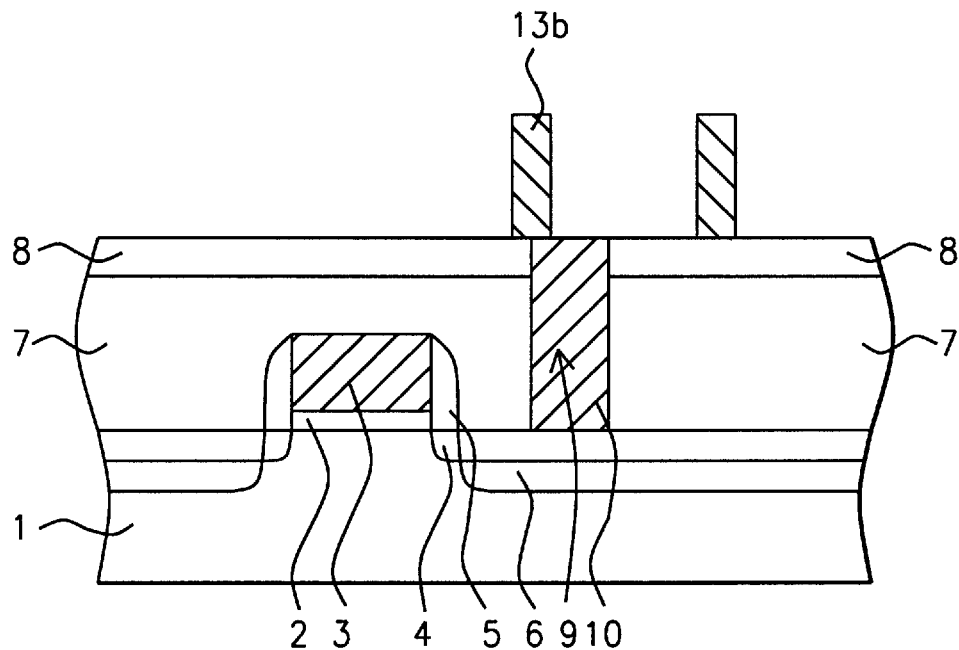
Figure 7:
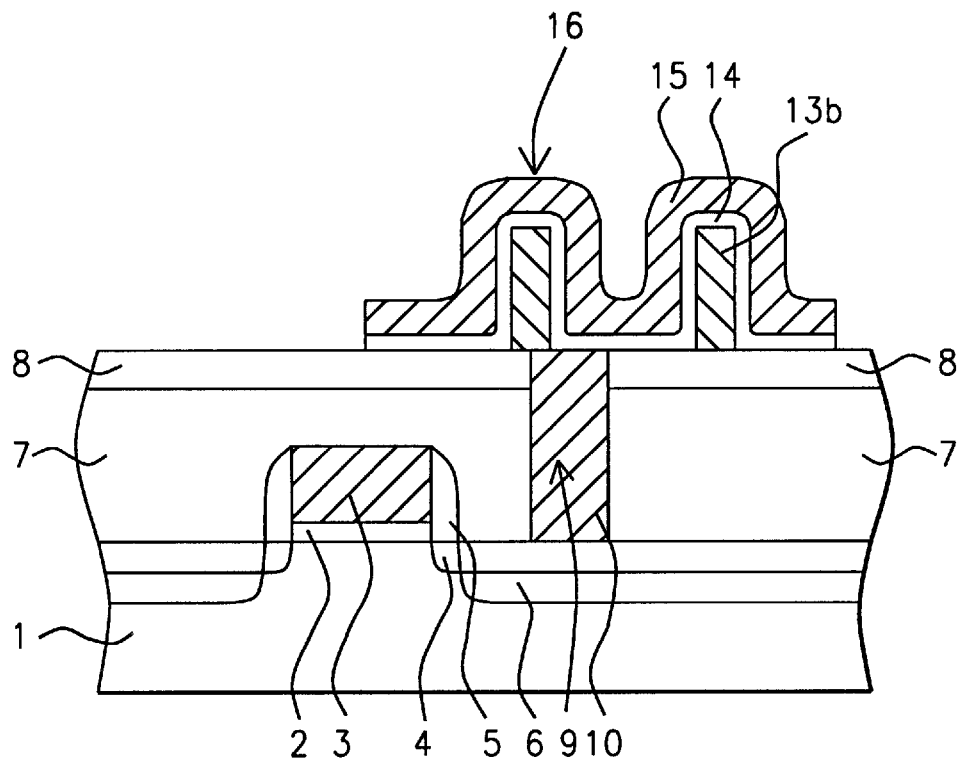

FIG. 6, schematically shows the result of selectively removing disposable insulator layer 11, from the top surface of insulator layer 8, via use of a buffered hydrofluoric acid solution. A capacitor dielectric layer 14, comprised of an ONO, (Oxidized Nitride on Oxide), layer, is next formed on cylindrical shaped, storage node structure 13b. This is schematically shown in FIG. 7. ONO layer 14, at an equivalent silicon oxide thickness between about 10 to 50 Angstroms, is formed via initial formation of a silicon oxide layer, on the underlying conductive layer, or polysilicon layer, of cylindrical shaped storage node structure 13b, at a thickness between about 200 to 1000 Angstroms,. via thermal oxidation, or via subjection to a hot sulfuric acid solution. A silicon nitride layer is next deposited on the underlying silicon oxide layer, via LPCVD or PECVD procedures, at a thickness between about 35 to 70 Angstroms, followed by a thermal oxidation procedure, used to convert a top portion of the silicon nitride layer to a silicon oxide layer, resulting in the ONO layer. If desired, capacitor dielectric layer 14, can be a tantalum oxide layer. Finally a polysilicon top plate structure 15, is formed, completing the fabrication of DRAM capacitor structure 16, shown schematically in FIG. 7, comprised of polysilicon top plate structure 15, capacitor dielectric layer 14; and cylindrical shaped, storage node structure 13b. Polysilicon top plate 15, is formed via initially depositing a polysilicon layer, using LPCVD procedures, at a thickness between about 500 to 2000 Angstroms, with the polysilicon layer doped in situ, during deposition, via the addition of arsine, or phosphine, to a silane ambient. Conventional photolithographic and RIE procedures, using $Cl_2$ as an etchant, are used to define polysilicon top plate structure 15. The defining photoresist shape is then removed using plasma oxygen ashing and careful wet clean procedures.

While this invention has been particularly shown and described with reference to, the preferred embodiments thereof, it will be understood by those skilled in the art that various changes in form and details may be made without departing from the spirit or scope of this invention.

What is claimed is:

1. A method of fabricating a capacitor structure, for a dynamic random access memory, (DRAM), device, on a semiconductor substrate, comprising the steps of:

providing a transfer gate transistor, comprised of a gate structure, on an underlying gate insulator layer, with a source/drain region in an area of said semiconductor substrate, not covered by said gate structure, or by insulator spacers;

forming a composite insulator layer, overlying said transfer gate transistor, comprised of an underlying, planarized, first insulator layer, and an overlying second insulator layer;

forming a storage node opening in said composite insulator layer, exposing a portion of a top surface of a source region, of said source/drain region;

forming a storage node plug structure in said storage node opening;

depositing a third insulator layer;

forming a capacitor opening in said third insulator layer, exposing a portion of a top surface of underlying, second insulator layer, and exposing a top surface of said storage node plug structure, located at periphery of said capacitor opening;

depositing a conductive layer on a top surface of said third insulator layer, and on all exposed surfaces, comprised of sides of, as well as a bottom of, said capacitor opening;

performing an anisotropic, dry etch procedure, to remove portions of said conductive layer located on the top surface of said third insulator layer, and to remove portions of said conductive layer located at the bottom of said capacitor opening, resulting in the formation of a cylindrical shaped, storage node structure, on the walls of said capacitor opening, with a segment of said cylindrical shaped, storage node structure, overlying, and contacting, a portion of said storage node plug structure, a portion of said second insulator layer, located at the periphery of said capacitor opening;

selectively removing said third insulator layer;

forming a capacitor dielectric layer, on said cylindrical shaped, storage node structure; and forming a conductive top plate structure, on said capacitor dielectric layer.

2. The method of claim 1, wherein said first insulator layer, of said composite insulator layer, is a silicon oxide layer, or a borophosphosilicate layer, obtained via LPCVD or PECVD procedures, at a thickness between about 5000 to 10000 Angstroms.

3. The method of claim 1, wherein said second insulator layer, of said composite insulator layer, is a silicon nitride layer, or a silicon oxynitride layer, obtained via LPCVD or PECVD procedures, at a thickness between about 200 to 1000 Angstroms.

4. The method of claim 1, wherein said storage node plug structure is formed from a polysilicon layer, obtained via LPCVD procedures, at a thickness between about 1000 to 3000 Angstroms, and doped in situ, during deposition, via addition of arsine, or phosphine, to a silane ambient.

5. The method of claim 1, wherein said third insulator layer is comprised of silicon oxide, obtained via LPCVD or PECVD procedures, at a thickness between about 5000 to 20000 Angstroms.

6. The method of claim 1, wherein said capacitor opening, in said third insulator layer, exposing the top surface of said storage node plug structure, at the periphery of said capacitor opening, is formed via an anisotropic RIE procedure, using $CHF_3$ as an etchant.

7. The method of claim 1, wherein said conductive layer is a polysilicon layer, obtained via LPCVD procedures, at a thickness between about 200 to 1000 Angstroms, and doped in situ, during deposition, via addition of arsine, or phosphine, to a silane ambient.

8. The method of claim 1, wherein said conductive layer is a tungsten layer, or a metal silicide layer, such as tungsten silicide, obtained via LPCVD procedures, at a thickness between about 200 to 1000 Angstroms.

9. The method of claim 1, wherein said anisotropic, dry etching procedure, used to form said cylindrical shaped, storage node structure, from said conductive layer, is an anisotropic RIE procedure, using $Cl_2$ as an etchant for said conductive layer.

10. The method of claim 1, wherein a level of overlying, and contact, between a segment of said cylindrical shaped, storage node structure, and a portion of the underlying, storage node plug structure, is between about 200 to 1000 Angstroms.

11. The method of claim 1, wherein said third insulator layer is selectively removed via use of a buffered hydrofluoric acid solution.

12. A method of fabricating a cylindrical shaped, storage node structure, for a DRAM capacitor structure, on a semiconductor substrate, in which contact between an overlying segment, of said cylindrical shaped, storage node structure, to a portion of an underlying storage node plug structure, is made at a periphery of a capacitor opening, comprising the steps of:

providing a transfer gate transistor, comprised of a gate structure, on an underlying gate insulator layer, with insulator spacers on sides of the gate structure, and a source/drain region, in an area of said semiconductor substrate, not covered by the gate structure;

depositing a first silicon oxide layer;

planarizing said first silicon oxide layer;

depositing a silicon nitride layer;

forming a storage node opening in said silicon nitride layer, and in said first silicon oxide layer, exposing a portion of a top surface of a source region, of said transfer gate transistor;

depositing a first polysilicon layer, completely filling said storage node opening;

removing a portion of said first polysilicon layer, from a top surface of said silicon nitride layer, forming a storage node plug structure, in said storage node opening;

depositing a second silicon oxide layer;

creating a capacitor opening in said second silicon oxide layer, exposing a portion of said silicon nitride layer, located at a bottom of said capacitor opening, and exposing a top surface of said storage node plug structure, located at an edge of said capacitor opening;

depositing a second polysilicon layer, on a top surface of said second silicon oxide layer, on sides of said capacitor opening, and at the bottom of said capacitor opening;

performing an anisotropic RIE procedure, removing a portion of said second polysilicon layer located on the top surface of said second silicon oxide layer, and removing a portion of said second polysilicon layer, located at the bottom of said capacitor opening, creating said cylindrical shaped, storage node structure, on the sides of said capacitor opening, with a segment of said cylindrical shaped, storage node structure, contacting underlying, said storage node plug structure, said silicon nitride layer, located at edge of said capacitor opening;

selectively removing said second silicon oxide layer from the top surface of said silicon nitride layer;

forming an Oxidized Nitride on Oxide, (ONO), capacitor dielectric layer, on said cylindrical shaped, storage node structure;

depositing a third polysilicon layer; and patterning of said third polysilicon layer, creating a polysilicon top plate, for said DRAM capacitor structure, comprised of said polysilicon top plate, said ONO capacitor dielectric layer, and underlying, said cylindrical shaped, storage node structure.

13. The method of claim 12, wherein said first silicon oxide layer is obtained via LPCVD or PECVD procedures, at a thickness between about 5000 to 10000 Angstroms.

14. The method of claim 12, wherein said silicon nitride layer is obtained via LPCVD or PECVD procedures, at a thickness between about 200 to 1000 Angstroms.

15. The method of claim 12, wherein said storage node plug structure is formed from said first polysilicon layer, with said first polysilicon layer obtained via LPCVD procedures, at a thickness between about 1000 to 3000 Angstroms, doped in situ, during deposition, via addition of arsine, or phosphine, to a silane ambient.

16. The method of claim 12, wherein said second silicon oxide layer is obtained via LPCVD or PECVD procedures, at a thickness between about 5000 to 20000 Angstroms.

17. The method of claim 12, wherein said capacitor opening is formed in said second silicon oxide layer, via an anisotropic RIE procedure, using $CHF_3$ as an etchant.

18. The method of claim 12, wherein said second polysilicon layer is obtained via LPCVD procedures, at a thickness between about 200 to 1000 Angstroms, and doped in situ, during deposition, via addition of arsine, or phosphine, to a silane ambient.

19. The method of claim 12, wherein said cylindrical shaped, storage node structure is formed via an anisotropic RIE procedure, performed on said second polysilicon layer, using $Cl_2$ as an etchant.

20. The method of claim 12, wherein between about 200 to 1000 Angstroms of overlying, said cylindrical shaped, storage node structure, overlays a portion of the top surface of said storage node plug structure.

21. The method of claim 12, wherein said second silicon oxide layer is removed selectively, via use of a buffered hydrofluoric acid solution.

* * * * *